(12) United States Patent
Hamada et al.

(10) Patent No.: US 7,341,775 B2
(45) Date of Patent: Mar. 11, 2008

(54) COMPOSITION FOR FORMING POROUS FILM, POROUS FILM AND METHOD FOR FORMING THE SAME, INTERLEVEL INSULATOR FILM, AND SEMICONDUCTOR DEVICE

(75) Inventors: Yoshitaka Hamada, Niigata-ken (JP); Fujio Yagihashi, Niigata-ken (JP); Hideo Nakagawa, Oumihachiman (JP); Masaru Sasago, Hirakata (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 422 days.

(21) Appl. No.: 10/706,861

(22) Filed: Nov. 12, 2003

(65) Prior Publication Data

US 2004/0235971 A1 Nov. 25, 2004

(30) Foreign Application Priority Data

Nov. 13, 2002 (JP) ............................. 2002-329125

(51) Int. Cl.
*H01L 23/48* (2006.01)

(52) U.S. Cl. ............... 428/304.4; 428/442; 428/447; 252/500; 252/511; 427/387; 427/226; 257/758; 438/637; 521/64; 521/154

(58) Field of Classification Search ............ 428/312.6, 428/304, 447; 438/447, 780–781; 502/407, 502/104; 501/12; 423/335, 338; 257/E21.27; 427/397.7; 106/287.1; 252/518.1

See application file for complete search history.

(56) References Cited

U.S. PATENT DOCUMENTS 4,634,509 A 1/1987 Shimizu et al.

(Continued)

FOREIGN PATENT DOCUMENTS

EP 1 205 438 A1 5/2002

(Continued)

OTHER PUBLICATIONS

Burkett et al, "Synthesis of hybrid inorganic-organic mesoporous silica by cocondensation of siloxane and organosiloxane precursors," J. Chem. Soc. Comm. 1996, pp. 1367-1368.*

(Continued)

*Primary Examiner*—Mark Kopec
*Assistant Examiner*—Kallambella Vijayakumar
(74) *Attorney, Agent, or Firm*—Alston & Bird LLP

(57) ABSTRACT

Provided are a composition for forming film which can form a porous film excelling in dielectric constant, adhesiveness, uniformity of the film, mechanical strength and having low hygroscopicity; a porous film and a method for forming the film; and a high-performing and highly reliable semiconductor device comprising the porous film inside. More specifically, provided is a composition for forming porous film, comprising
  a surfactant and
  a solution comprising polymer obtainable by hydrolyzing and condensing, in the presence of the surfactant, one or more of alkoxysilane represented by Formula (1) and one or more of alkoxysilane represented by Formula (2):

$$(R^1)_m Si(OR^2)_{4-m} \tag{1}$$

$$R^3 Si(R^4)_n (OR^5)_{3-n} \tag{2}$$

Also provided is a method for forming porous film comprising a step of applying said composition on a substrate to form film and a step of transforming the film into porous film.

14 Claims, 2 Drawing Sheets

U.S. PATENT DOCUMENTS

| | | | |
|---|---|---|---|
| 5,385,955 A * | 1/1995 | Tarshiani et al. ............ 522/31 |
| 5,494,859 A * | 2/1996 | Kapoor ...................... 438/477 |
| 5,707,783 A | 1/1998 | Stauffer et al. |
| 5,755,867 A * | 5/1998 | Chikuni et al. ........ 106/287.16 |
| 6,037,275 A | 3/2000 | Wu et al. |
| 6,197,913 B1 | 3/2001 | Zhong |
| 6,313,045 B1 | 11/2001 | Zhong et al. |
| 6,342,097 B1 * | 1/2002 | Terry et al. ............ 106/287.13 |
| 6,359,096 B1 | 3/2002 | Zhong et al. |
| 6,376,634 B1 | 4/2002 | Nishikawa et al. |
| 6,387,453 B1 * | 5/2002 | Brinker et al. ............... 427/387 |
| 6,391,999 B1 | 5/2002 | Crivello |
| 6,413,647 B1 | 7/2002 | Hayashi et al. |
| 6,512,071 B1 | 1/2003 | Hacker et al. |
| 6,533,855 B1 | 3/2003 | Gaynor et al. |
| 6,534,025 B1 | 3/2003 | Yano et al. |
| 6,596,404 B1 | 7/2003 | Albaugh et al. |
| 6,632,489 B1 | 10/2003 | Watanabe et al. |
| 6,639,015 B1 | 10/2003 | Nakashima et al. |
| 6,696,538 B2 | 2/2004 | Ko et al. |
| 2002/0020327 A1 | 2/2002 | Hayashi et al. |
| 2002/0098279 A1 | 7/2002 | Lyu et al. |
| 2002/0132908 A1 * | 9/2002 | Yagihashi et al. .......... 524/506 |
| 2002/0155053 A1 | 10/2002 | Nishiyama et al. |
| 2002/0160207 A1 | 10/2002 | Kohmura et al. |
| 2003/0064321 A1 | 4/2003 | Malik et al. |
| 2003/0091838 A1 | 5/2003 | Hayashi et al. |
| 2003/0104225 A1 | 6/2003 | Shiota et al. |
| 2003/0157311 A1 * | 8/2003 | MacDougall et al. .... 428/304.4 |

FOREIGN PATENT DOCUMENTS

| | | | |
|---|---|---|---|
| EP | 1223192 | | 7/2002 |
| EP | 1245642 | | 10/2002 |
| EP | 1 123 753 A2 | | 8/2003 |
| JP | 63-015355 | | 4/1988 |
| JP | 5-125191 | | 5/1993 |
| JP | 06-145599 | | 5/1994 |
| JP | 09-194298 | | 7/1997 |
| JP | 11-246665 | * | 9/1999 |
| JP | 2000-044875 | | 2/2000 |
| JP | 2000-309751 | | 11/2000 |
| JP | 2000-309753 | | 11/2000 |
| JP | 2000-345041 | | 12/2000 |
| JP | 2001-002993 | | 1/2001 |
| JP | 2001-49178 | | 2/2001 |
| JP | 2001-049178 | * | 2/2001 |
| JP | 2001-49179 | | 2/2001 |
| JP | 2001-055554 | | 2/2001 |
| JP | 2001-080915 | | 3/2001 |
| JP | 2001-98218 | | 4/2001 |
| JP | 2001-098218 | * | 4/2001 |
| JP | 2001-115021 | | 4/2001 |
| JP | 2001-115028 | | 4/2001 |
| JP | 2001-115029 | | 4/2001 |
| JP | EP 1205438 | * | 4/2001 |
| JP | 2001-130911 | | 5/2001 |
| JP | 2001-131479 | | 5/2001 |
| JP | 2001-157815 | | 6/2001 |
| JP | 2001-164186 | | 6/2001 |
| JP | 2001-203197 | | 7/2001 |
| JP | 2001-240798 | | 9/2001 |
| JP | 2001-354904 | | 12/2001 |
| JP | 2002-020688 | | 1/2002 |
| JP | 2002-020689 A | | 1/2002 |
| JP | 2002-023354 | | 1/2002 |
| JP | 2002-030249 | * | 1/2002 |
| JP | 2002-30249 | | 1/2002 |
| JP | 2002-030249 A | | 1/2002 |
| JP | 2002-038090 A | | 2/2002 |
| WO | WO 00/12640 | | 3/2000 |
| WO | WO 03/088344 | | 10/2003 |

OTHER PUBLICATIONS

Burkett et al., "Synthesis Of Hybrid Inorganic-Organic Mesoporous Silica By Co-Condensation Of Siloxane And Organosiloxane Precursors," *J. Chem. Soc. Chem. Commun.*, 1996, 1367-1368.

International Search Report from International Application No. PCT/JP03/14437 dated Jan. 29, 2004.

Inagaki et al., "Synthesis Of Highly Ordered Mesoporous Materials From A Layered Polysilicate", *J. Chem. Soc. Chem. Commun.*, 1993, pp. 680-682.

Supplementary European Search Report for corresponding European Patent Application No. 03 81 1129 dated Dec. 8, 2005.

* cited by examiner

COMPOSITION FOR FORMING POROUS FILM, POROUS FILM AND METHOD FOR FORMING THE SAME, INTERLEVEL INSULATOR FILM, AND SEMICONDUCTOR DEVICE

CROSS-REFERENCE TO RELATED APPLICATION

The present application claims priority to Japanese Patent Application No. 2002-329125, filed Nov. 13, 2002, the disclosure of which is incorporated herein by reference in its entirely.

BACKGROUND OF THE INVENTION

1. Field of the Invention

The present invention relates to a composition for film formation, which can be formed into a porous film that excels in dielectric properties, adhesion, film consistency and mechanical strength, and has reduced absorption; a porous film and a method for forming the same; and a semiconductor device, which contains the porous film inside.

2. Description of the Related Art

The porous silica material which is produced through hydrolysis and polycondensation of the silica precursor in the presence of micelle has attracted attention because it has a narrow pore distribution with nanometer size, high regularity of structure and extremely high mechanical strength. The application of support for various catalysts and others has been being studied.

According to Japanese Patent Provisional Publication No. 2001-157815, this porous silica material is applied for a moisture absorbent because it is generally extremely hygroscopic and can absorb water vapor even under low relative vapor pressure. However, the application of the porous silica material as the material having the low dielectric constant has a problem because its hygroscopic property leads to high dielectric constant. Therefore, the haste measure has to be taken to correct the problem.

According to one of reported methods of preventing moisture absorption, as soon as the silica porous body medium is formed, its surface is subjected to moisture-preventing coating. In another method, the formed silica porous body is reacted with a silylation agent such as hexamethyldisilazanes so that a trimethylsilyl group is introduced on the surface of the silica porous body for enhancing hydrophobicity.

Although these methods can prevent the silica film from absorbing moisture, it is necessary that these treatments have to be performed as soon as the silica film is formed. Accordingly, these methods result in complicated process. Moreover, complicated operations such as adjusting the atmosphere during the treatment and storage are required.

In the method using hexamethyldisilazan, influence of the possible amine residue on the subsequent process is concerned. Thus, a method for obtaining a hydrophobic porous silica film which does not require said hydrophobic treatment has been sought.

Moreover, Sandra L. Burkett et al. proposed the method for producing hydrophobic silica bulk by hydrolyzing the composition contain phenyltriethoxysilane or n-octyltriethoxysilane in tetraethoxysilane in the presence of ammonium salt micelle. However, the n-octyl product which is expected to have more hydrophobicity cannot maintain its shape during the removal of the ammonium salt by washing with ethanol containing hydrochloric acid (J. Chem. Soc., Chem. Commun., 1996, 1367). The phenyl product is contained in a large portion such as 10 wt % and 20 wt % so that it seems to have made not only the surface but also the silica itself hydrophobic.

As mentioned above, it is very difficult to prevent the silica porous body from absorbing moisture. When the porous film made of the silica porous body is used as an insulator film in multi-level interconnects of the semiconductor device, there are problems such that moisture-absorbed porous film increases dielectric constant and lowers the adhesiveness in the lamination of films. Moreover, when the dielectric constant of the porous film used as an insulator film increases, the RC delay in the multi-level interconnects of the semiconductor device is increased. Consequently, the performance of the semiconductor device (high speed and low power consumption) has not been improved. Furthermore, when conventional porous film is incorporated into multi-level interconnects, there is a problem of the film having insufficient mechanical strength. The low mechanical strength results from the porous film property. Thus, there is a problem that low mechanical strength of the porous film as an insulator film lowers the reliability of a semiconductor device.

SUMMARY OF THE INVENTION

An object of the invention is to provide a composition for forming film which can form a porous film excelling in dielectric constant, adhesiveness, uniformity of the film, mechanical strength and having low hygroscopicity. Moreover, an object of the invention is to provide a high-performing and highly reliable semiconductor device comprising the porous film inside.

The inventors have given special consideration to the interaction between the silica precursor and the surfactant which can form micelle based on the result of the previous studies. The core of the micelle contains a hydrophobic region as shown in FIG. 1. When a hydrolyzable silicon compound comprising a long chain alkyl group which is soluble in the hydrophobic region is added into the micelle, the silicon atom having the long chain alkyl group is localized near the micelle. It is fixed through hydrolysis and condensation. In addition, the sintering or the like removes the surfactant which forms micelle so that pores are produced. The high concentration of the silicon atom containing the long chain alkyl group is present on the surface of the pores. Te invention has reached the completion through these findings.

According to the present invention, provided is a composition for forming porous film, comprising
a surfactant and
a solution comprising polymer obtainable by hydrolyzing and condensing, in the presence of the surfactant, one or more of alkoxysilane represented by Formula (1) and one or more of alkoxysilane represented by Formula (2):

wherein $R^1$ represents a monovalent hydrocarbon group which may be substituted or non-substituted and when there are $R^1$s, the $R^1$s may be independently same or different; $R^2$ represents an alkyl group having 1 to 4 carbons and when there are $R^2$s, the $R^2$s may be independently same or different; $R^3$ represents a straight chain or branched alkyl group having 8 to 30 carbons; $R^4$ represents a monovalent hydrocarbon group which may be substituted or non-substituted and when there are $R^4$s, the $R^4$s may be independently same or different; $R^5$ represents an alkyl group having 1 to 4 carbons and when there are $R^5$s, the $R^5$s may be independently same or different; m is an integer of 0 to 3; and n is an integer of 0 to 2.

Moreover, according to the invention, provided is a method for forming porous film comprising a step of applying said composition on a substrate to form film, a subsequent step of drying and a step of forming porous film by removal of the surfactant. Further, according to the invention, provided is porous film obtainable from the composition.

According to the invention, an amount of the component comprising a long chain alkyl group is reduced, while the content of the tetraalkoxysilane component necessary for keeping the film strength is kept high. In addition, because the component comprising a long chain alkyl group which is expected to have bad influence on the film strength is localized on the surface, the main frame can maintain the film strength derived from the tetraalkoxysilane.

The semiconductor device of the invention comprises internal porous film which is formable by a composition for forming porous film, comprising a surfactant and a solution comprising polymer obtainable by hydrolyzing and condensing, in the presence of the surfactant, one or more of alkoxysilane represented by Formula (1) and one or more of alkoxysilane represented by Formula (2):

$(R^1)_m Si(OR^2)_{4-m}$          (1)

$R^3 Si(R^4)_n (OR^5)_{3-n}$          (2)

wherein $R^1$ represents a monovalent hydrocarbon group which may be substituted or non-substituted and when there are $R^1$s, the $R^1$s may be independently same or different; $R^2$ represents an alkyl group having 1 to 4 carbons and when there are $R^2$S, the $R^2$s may be independently same or different; $R^3$ represents a straight chain or branched alkyl group having 8 to 30 carbons; $R^4$ represents a monovalent hydrocarbon group which may be substituted or non-substituted and when there are $R^4$s, the $R^4$s may be independently same or different; $R^5$ represents an alkyl group having 1 to 4 carbons and when there are $R^5$s, the $R^5$s may be independently same or different; m is an integer of 0 to 3; and-n is an integer of 0 to 2.

More specially, the porous film can be used as an insulator film of the multi-level interconnections.

The surfactant may be preferably a compound which decomposes, evaporates or sublimes when heated to 400° C. or less.

One or more of alkoxysilane represented by Formula (2) may be of 0.01 to 10 parts by weight toward 100 parts by weight of said one or more of alkoxysilane represented by Formula (1).

It may be preferable that one or more of the alkoxysilane represented by Formula (1) are tetraalkoxysilane and the other compound or compound, and an amount of the tetraalkoxysilane is 10% by weight or more in said alkoxysilane represented by Formula (1).

It may be preferable to comprise the compound which is neutral at ordinary temperature and generates acid or alkali at 80 to 200° C.

According to the semiconductor device of the invention, the semiconductor device comprising the insulator film having low dielectric constant inside can be realized, keeping the mechanical strength of the porous film secured and reducing the moisture absorption. Because of the lowered dielectric constant of the insulator film, the parasitic capacitance around the multi-level interconnections is reduced so that fast performance and low consumption power of the semiconductor device can be achieved.

Moreover, according to the semiconductor of the invention, it may be preferable that the porous film is between metal interconnections in a same layer of multi-level interconnects, or is between upper and lower metal interconnection layers. Consequently, the high performance and highly reliable semiconductor device can be realized.

The composition of the invention excels in storage stability. It can form a porous film which has low dielectric constant, is flat and uniform, and has low hygroscopicity and high mechanical strength. The poreous film may be best suited for the interlevel insulator film when used in the semiconductor. In addition, use of the porous film formed by the composition of the present invention as an insulator film of multilayered interconnections can realize a high-performing and highly reliable semiconductor device.

DETAILED DESCRIPTION OF THE PREFERRED EMBODIMENTS

Figure 1:
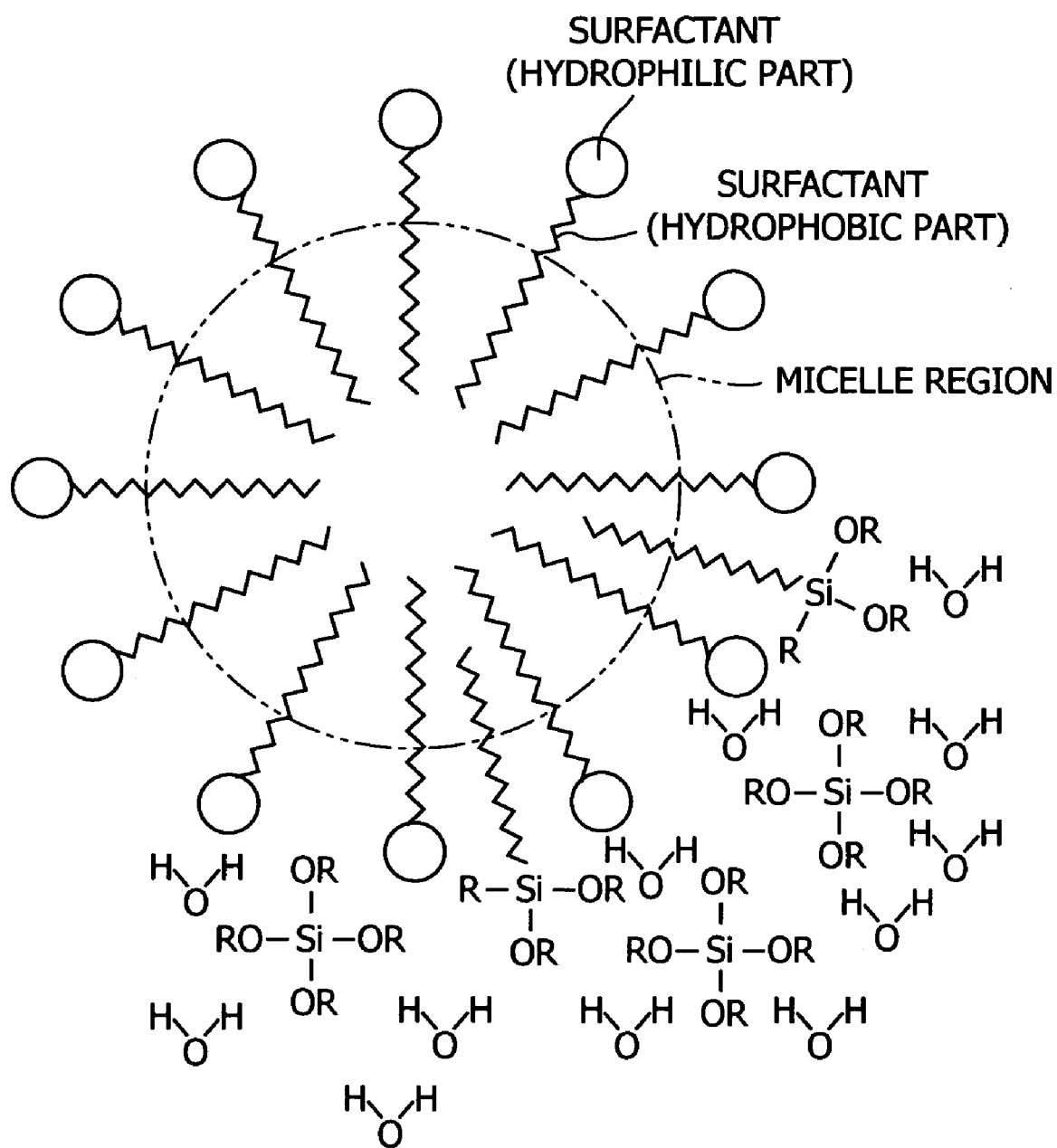
FIG. 1 relates to an example of the composition for forming porous film of the invention and shows a pattern diagram exhibiting mutual interaction of each component.

In the silane compound represented by Formula (1) used for this invention, $R^1$ represents a monovalent hydrocarbon group which may be substituted. The $R^1$ may preferably represent a straight chain or branched alkyl group having 1 to 7 carbons or an aryl group wherein both groups may have a substituent. The $R^1$ may include methyl, ethyl, propyl, isopropyl, butyl, isobutyl, sec-butyl, tert-butyl, pentyl, sec-pentyl, neopentyl, hexyl, heptyl, phenyl, o-tolyl, m-tolyl, p-tolyl and benzyl groups.

In Formula (1), $R^2$ represents an alkyl group having 1 to 4 carbons. The $R^2$ may include methyl, ethyl, propyl, isopropyl and butyl group. In Formula (1), m is an integer of 0 to 3. It becomes a tetraalkoxysilane for m=0.

The silane compound represented by Formula (1) may include, but is not limited to, tetramethoxysilane, tetraethoxysilane, tetrapropoxysilane, tetrabutoxysilane, methyltrimethoxysilane, methyltriethoxysilane, methyltripropoxysilane, ethyltrimethoxysilane, propyltrimethoxysilane, butyltrimethoxysilane, pentyltrimethoxysilane, hexyltrimethoxysilane, 2-ethylhexyltrimethoxysilane, phenyltrimethoxysilane, dimethyldimethoxysilane, dimethyldiethoxysilane, trimethylmethoxysilane, triethylmethoxysilane and butyldimethylmethoxysilane.

In the silane compound represented by Formula (2) used in the invention, the $R^3$ represents a straight chain or branched alkyl group having 8 to 30 carbons. The $R^3$ may include n-octyl, n-decyl, n-dodecyl (lauryl), n-tetradecyl (myristyl), n-hexadecyl (cetyl), n-octadecyl (stearyl), 1-hexyl-hexyl, 4-hexyl-cyclohexyl, 3-hexyl-1-norbornyl, n-triacontyl and n-eicosanyl groups.

In the silane compound represented by Formula (2) used in the invention, $R^4$ represents a monovalent hydrocarbon which may be substituted. The $R^4$ may preferably represent a straight chain or branched alkyl group having 1 to 7 carbons or an aryl group wherein both of the groups may be substituted. Example of $R^4$ may include those described as examples of $R^1$ in Formula (1).

In Formula (2), $R^5$ represents an alkyl group having 1 to 4 carbons. The $R^5$ may include methyl, ethyl, propyl, isopropyl and butyl groups. In Formula (2), n is an integer of 0 to 2.

The silane compound expressed by Formula (2) may include, but are not limited to, octyltrimethoxysilane, n-decyltrimethoxysilane, n-dodecyltrimethoxysilane, n-tetradecyltrimethoxysilane, n-hexadecyltrimethoxysilane, n-octadecyltrimethoxysilane, 1-hexyl-hexyltriethoxysilane, 4-hexyl-cyclohexyltrimethoxysilane, 3-hexyl-1-norbornyltrimethoxysilane, n-triacontyltrimethoxysilane, n-eicosanyltrimethoxysilane, n-dodecylmethyldimethoxysilane, n-tetradecylmethyldimethoxysilane, n-hexadecylmethyldimethoxysilane and n-octadecylmethyldimethoxysilane.

The silane compounds represented by Formulas (1) and (2) can be converted to a polymer solution through hydrolysis and condensation. These silane compounds may be preferably converted to a polymer solution through hydrolysis and condensation in the presence of water under the acidic condition containing acid as catalyst or under the basic condition containing a base as catalyst. The acid used in this reaction may include inorganic acid such as hydrochloric acid, sulfuric acid and nitric acid; sulfonic acid such as methanesulfonic acid, benzenesulfonic acid, p-toluenesulfonic acid and trifluoromethanesulfonic acid; organic acid such as formic acid, acetic acid, propionic acid, oxalic acid, malonic acid, fumaric acid, maleic acid, tartaric acid, citric acid and maleic acid; and phosphoric acid. The base used in this reaction may include ammonia, triethylamine, octylamine, pyridine, aniline and pyrrole. The amount of water for the hydrolysis may be 0.5 to 10 times, more preferably 1.0 to 4.0 times the mole amount required for complete hydrolysis of the silane compound. When the silane compoupounds represented by Formulas (1) and (2) are converted to a-polymer solution through hydrolysis and condensation, in addition to water, alcohol corresponding to the alkoxy group of the silane compound, acetone, MIBK (methyl isobutyl ketone), 1-butanol, cyclohexanone, DMF (dimethylformamide), DMSO (dimethylsulfoxide), NMP (N-methylpyrrolidone), DMA (N,N-dimethylacetamide), acetonitrile, tetrahydrofuran, ethyl lactate, propylene glycol monomethyl ether, PGMEA (propylene glycol methyl ether acetate) and MMP (methoxymethyl propionate) can be contained. The amount of the solvent except water may be 5 to 50% of the NV, based on the weight of the silane compound after complete hydrolysis and condensation. Herein, the NV is a value obtained by dividing the weight in sintered state by the weight in the solution state.

The 0.01 to 10 parts by weight of the alkoxysilane represented by Formula (2) may be added based on 100 parts by weight of the alkoxysilane represented by Formula (1). When less than 0.01 parts by weight of the alkoxysilane represented by Formula (2) is added, the hydrophobic properties may be insufficient. When more than 10 parts by weight of the alkoxysilane represented by Formula (2) is added, the film strength after sintering may decreases. It is also economically undesirable.

The alkoxysilane represented by Formula (1) may be preferably tetraalkoxysilane and the other compound or compounds, and an amount of the tetraalkoxysilane may be preferably 10% by weight in said alkoxysilane represented by Formula (1). Consequently, the strength of the sintered film can be kept sufficiently high.

The surfactant used in this invention may not be particularly limited as long as it can form micelle by being dissolved in the solution of silane compounds represented by Formulas (1) and (2). The preferable surfactant may be a quaternary ammonium salt which can be used as a cationic surfactant. Moreover, The surfactant may be preferably a compound which decomposes, evaporates or sublimes when heated to 400° C. or less, preferably 150 to 400° C.

The quaternary ammonium salt may be preferably an alkyltrimethylammonium salt represented by Formula (3):

$$R^6N^+(CH_3)_3X^- \quad (3)$$

wherein $R^6$ represents a straight chain or branched alkyl group having 8 to 20 carbons and X represents an atom or a functional group which can form an anion.

The quaternary ammonium salt may be preferably a trimethylammonium salt comprising one straight chain alkyl group having 12 to 18 carbons and examples may include, but not limited to, dodecyltrimethylammonium chloride, dodecyltrimethylammonium bromide, dodecyltrimethylammonium iodide, tetradecyltrimethylammonium chloride, tetradecyltrimethylammonium bromide, tetradecyltrimethylammonium iodide, hexadecyltrimethylammonium chloride, hexadecyltrimethylammonium bromide, hexadecyltrimethylammonium iodide, hexadecyltrimethylammonium formate, hexadecyltrimethylammonium acetate, hexadecyltrimethylammonium oxalate, hexadecyltrimethylammonium trifluoroacetate, hexadecyltrimethylammonium methanesulfonate, hexadecyltrimethylammonium trifluoromethanesulfonate, hexadecyltrimethylammonium hydroxide, stearyltrimethylammonium chloride and stearyltrimethylammonium bromide.

The quaternary ammonium salt can be uniformly dissolved in the solution of the silane compounds represented by Formulas (1) and (2) simply by mixing and stirring. However, the maximum amount which can be dissolved uniformly depends on the ammonium salt used. Thus, the amount of the quaternary ammonium salt to be added may change depending on the material system. The typical amount of the quaternary ammonium salt may be 0.01 to 0.5 mole % based on the mole of the silane compounds represented by Formulas (1) and (2).

The composition for forming porous film of the invention may preferably comprise a compound which is neutral at ordinary temperature and generates acid or alkali at 80 to 200° C. The compound may preferably include imine sulfonates, onium salts, diazomethane derivatives, sulfonates, triazine derivatives and oxycarbonyl of amine. The compound promotes the condensation reaction of the silanol and the alkoxysilane, or performs skeleton reaction thereof. The desirable content of the compound may be preferably 0.01 to 20% by weight, more preferably 0.5 to 5% by weight based on the weight of the silane compound represented by Formula (1) which is a main component.

Examples of imine sulfonates, onium salts, diazomethane derivatives, sulfonates, triazine derivatives and oxycarbonly of amine are as follows:

(1) imine sulfonates
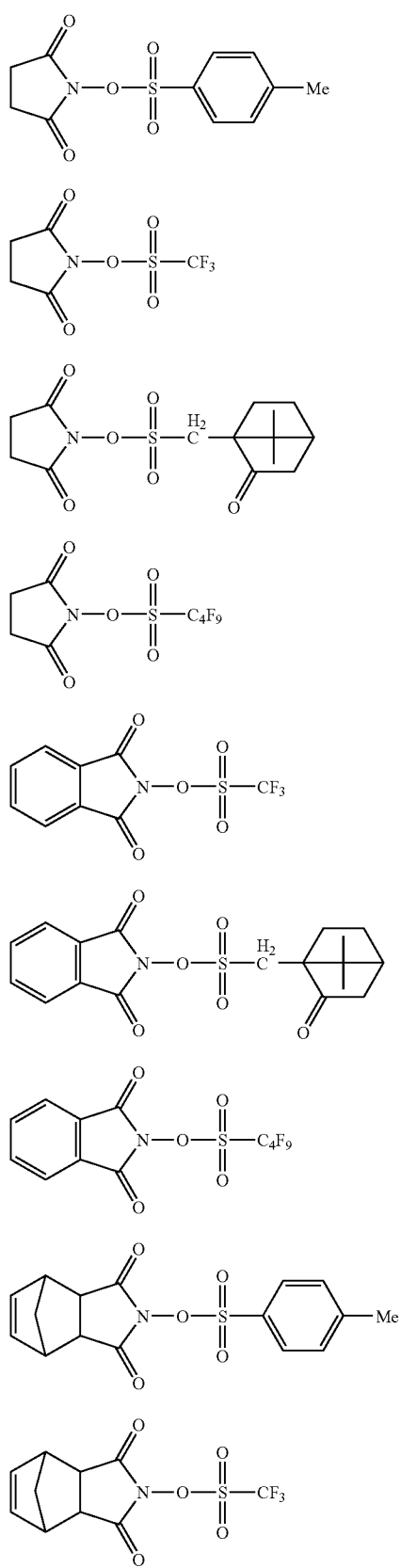
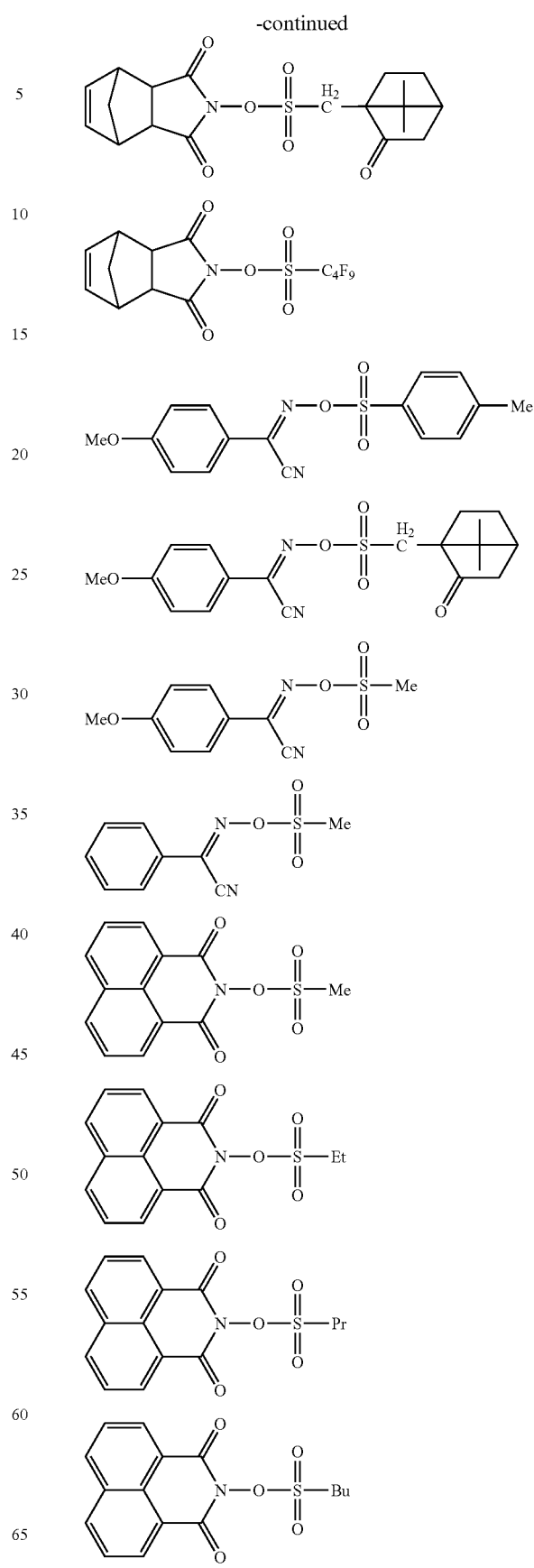

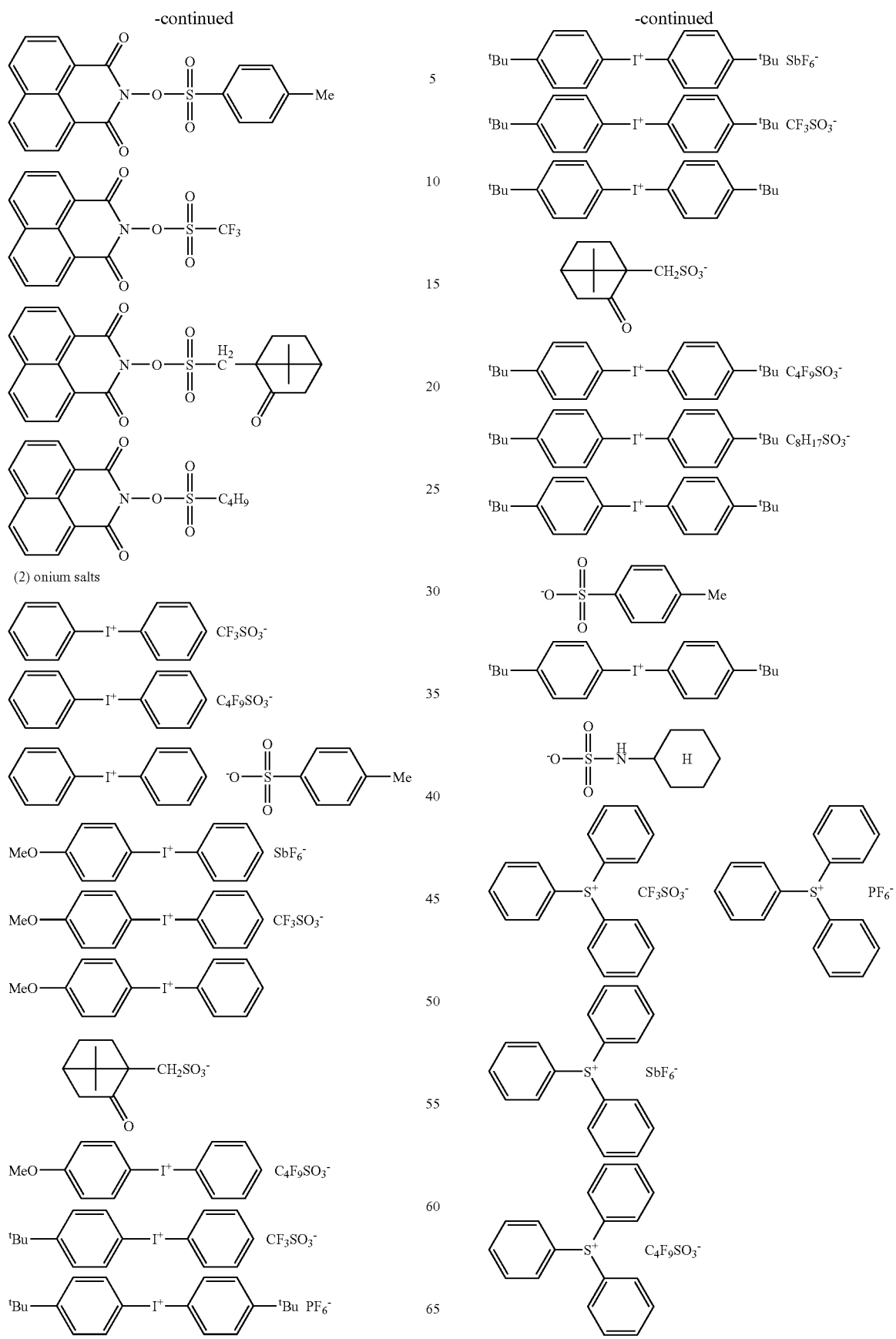
(2) onium salts

-continued
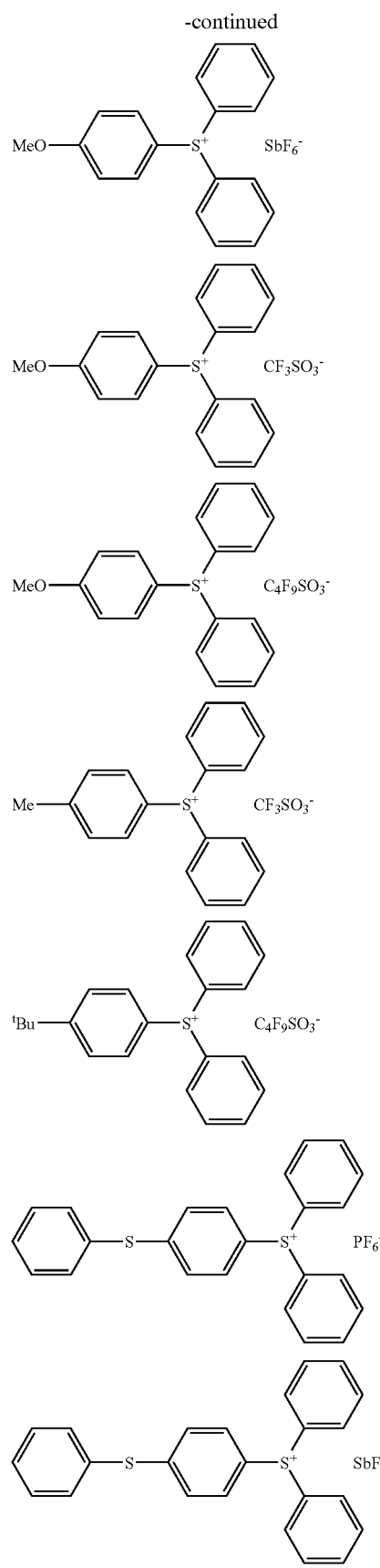
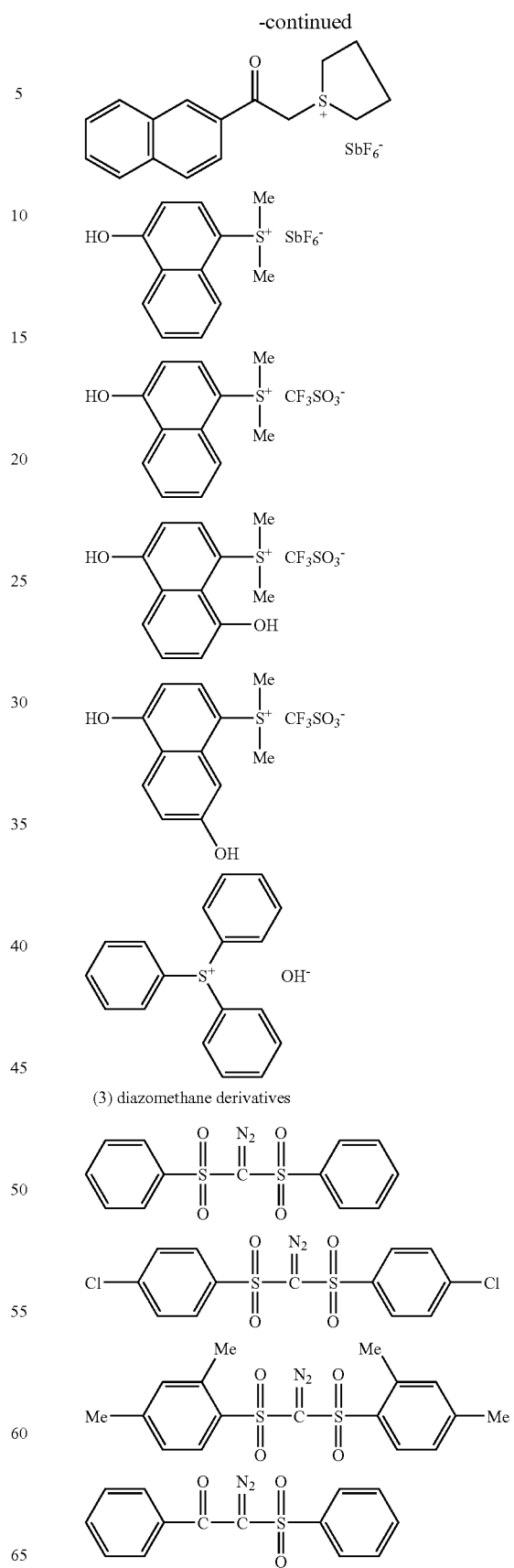
(3) diazomethane derivatives

-continued
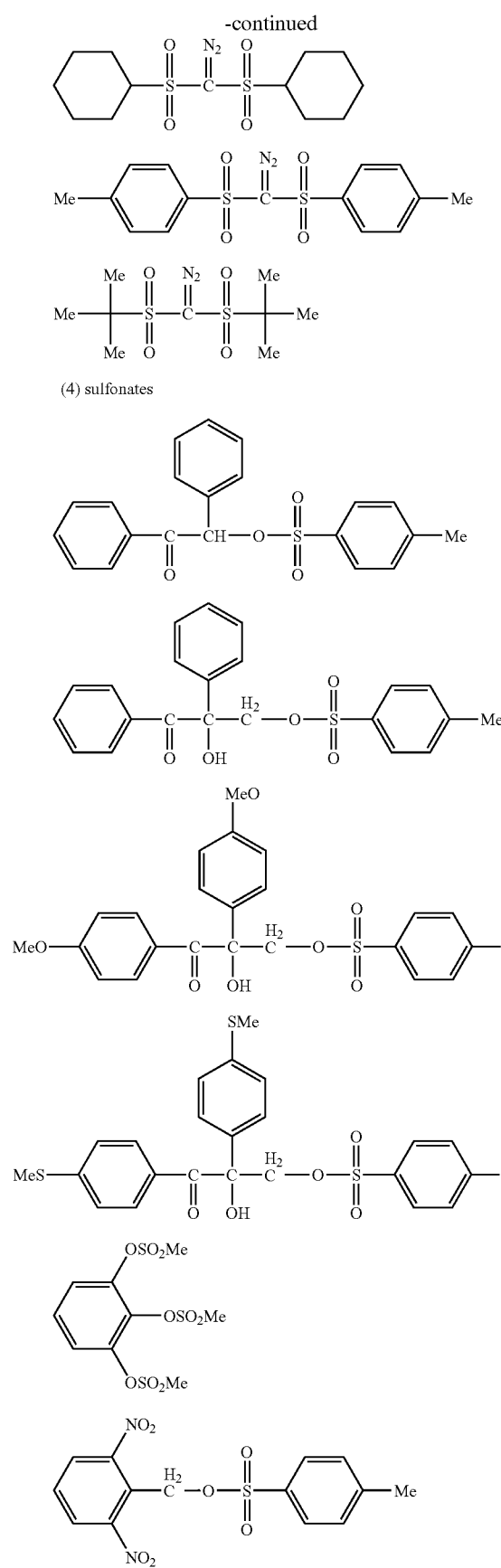
(4) sulfonates
-continued
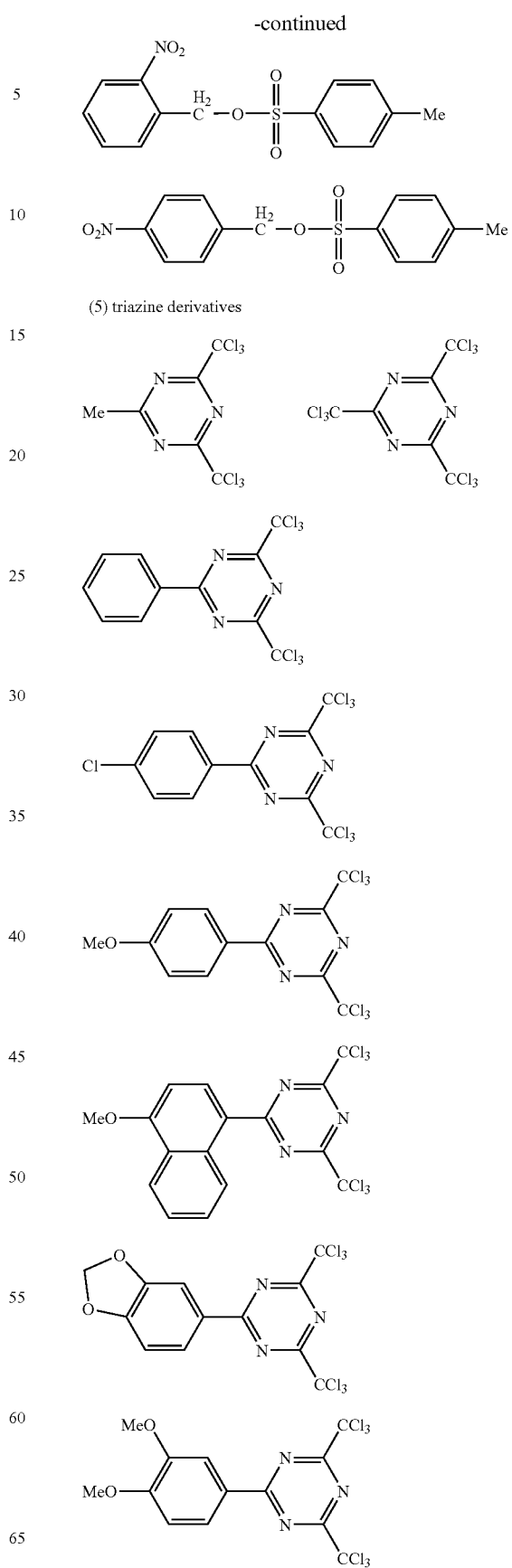
(5) triazine derivatives -continued

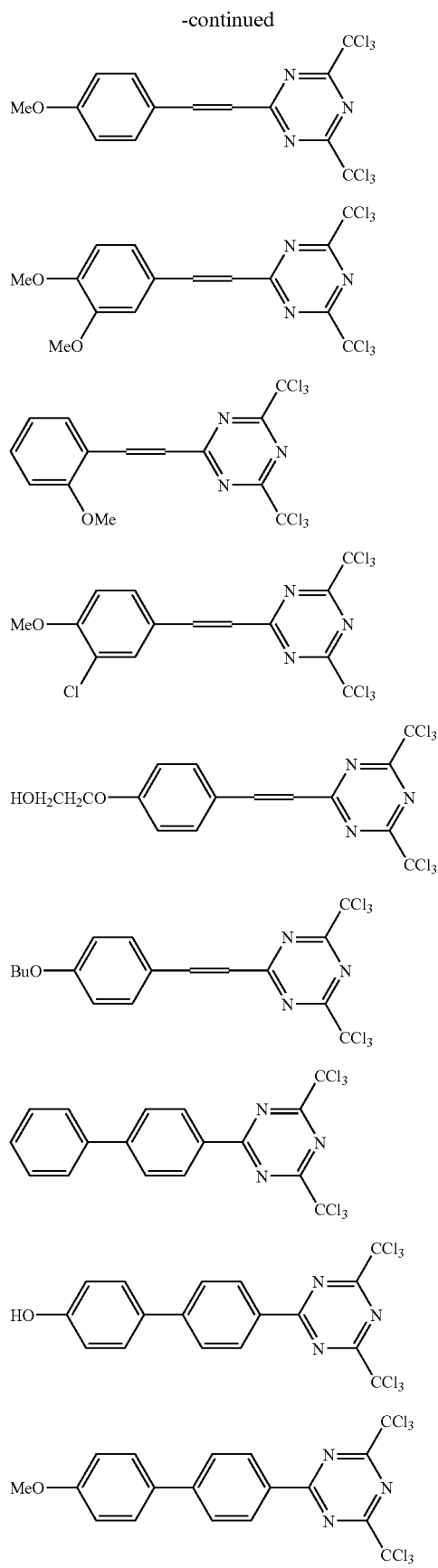

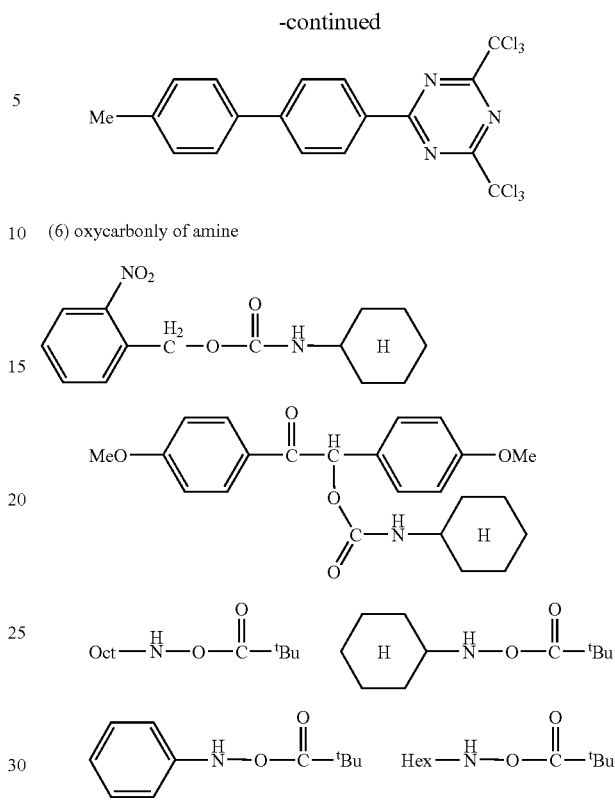

(6) oxycarbonly of amine

The hydrolysis and condensation reactions of the silane may be carried out under the same condition which is used for usual hydrolysis and condensation reactions. The reaction temperature may be typically from 0° C. to the boiling point of alcohol which is produced through the hydrolysis and condensation. The reaction temperature may be preferably room temperature to 60° C.

Although the reaction time may not be especially limited, it may be typically 10 minutes to 18 hours, preferably 30 minutes to 3 hours.

A preferable weight-average molecular weight of the polymer produced by the silane compounds represented by Formulas (1) and (2) may be 500 to 10,000 with Gel Permeation Chromatography (GPC), using polyethylene as a standard.

Although the polymer solution thus prepared may be used as it is, it may be also used after a small amount of the other component or components are added thereto. The other component may include titanium oxide, aluminum oxide and zirconium oxide and may be added in a preferable amount of 0 to 20% by weight based on the weight of the silane compound represented by Formula (1) which is a main component.

The composition for forming porous film of the invention can be used as a coating liquid. For example, after the concentration of the solute is controlled, the composition can be spin-coated with an appropriate frequency of rotations so that film having desirable thickness can be produced. The film typically has actual thickness of about 0.1 to 2 μm and is then treated in a drying step to remove the solvent. The method of coating is not limited to spin coating and may include scan coating, dip coating and bar coating.

The film thus prepared may be heated preferably at 80 to 200° C. for several minutes in a drying step (generally called pre-bake in the semiconductor process) so that the solvent is removed.

The film thus prepared may be treated to have pores in the pores-forming step. When the film is heated at high temperature, the surfactant may be decomposed, evaporated or sublimed, resulting in the removal of the surfactant from the film. Consequently, the space in which the surfactant has occupied becomes pores. The temperature may not be limited as long as it is high enough for the surfactant to decompose, evaporate or sublime. The temperature may be preferably 150 to 400° C.

In case that the surfactant which has formed micelle is removed by thermal decomposition and evaporation, the silane component comprising a straight chain or branched alky group may preferably comprise a methyl group on the silicon atom at the same time. It is because part of the straight chain or branched alky group is recognized to undergo the thermal decomposition and evaporation.

The film which has been subjected to the treatment for removing the surfactant has a very large surface area. The surface area of 2,000 to 4,000 $m^2/g$ is usually obtained in the measurement of surface area (with Shimazu tristar 3000) in accordance with the BET method using adsorption of a nitrogen gas. Consequently, the film can have very small dielectric constant. According to the invention, the porous film may have dielectric constant of 2.5 or less based on the measurement using the Mercury Probe Method. Moreover, when the porous film is exposed to saturated water vapor for 24 hours, the dielectric constant thereof may rise by 1.0 or less, exhibiting the porous silica film becomes hydrophobic so that the absorption of the water vapor is suppressed.

The porous film thus obtained may also have extremely narrow pore distribution, typically 1 to 3 nm, and have almost no pores exceeding 3 nm. It can be confirmed with the BET surface area measuring device (Shimazu tristar 3000) using the nitrogen gas absorption method.

Because of the uniform pore distribution and the pores having a channel structure, the obtained film has good mechanical strength in spite of having high occupancy ratio of pores in the entire film. The film may have typically 0.5 to 1.5 GPa of hardness and 5.0 to 10 GPa of modulus of elasticity according to the measurement by the nanoindentation. On the other hand, according to the measurement of usual porous material having pores produced thermally by removing the thermally decomposable polymers which have been contained in the silicone resin, the hardness is 0.05 to 2 Gpa and the modulus of elasticity is about 1.0 to 4.0 GPa. Thus, the mechanical strength of the film of the invention is extremely high.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity (dielectric constant) of the interlevel insulator film disposed between metal interconnections. When an interlevel insulator film is prepared by using the composition for forming porous film of the invention, the semiconductor device can be downsized and faster and consume less power.

However, there is a problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process, which is generally used in the fabrication process. Particularly, when used as the interlevel insulator film of a semiconductor, the porous film of the invention having high mechanical strength despite the porosity prevents such exfoliation. Consequently, a highly reliable semiconductor having high speed performance in a small size can be provided.

However, because the introduction of pores greatly increases the surface area and the film itself is of hydrophilic silica quality, the surface and inside of the porous film can have water adsorption which will fatally damage the electrical property. In order to prevent it, although a protection layer on the surface or a hydrophobic treatment on the sintered is attempted, the production process becomes more complicated as well as the complicated moisture control or the like between steps is required. On the contrary, the according the invention, the sintered film has hydrophobic surface formed not only on the surface of the film but also inside of the pores during sintering so that electrical property of the film is greatly stabilized and the production process of the film can be simplified.

Figure 2:
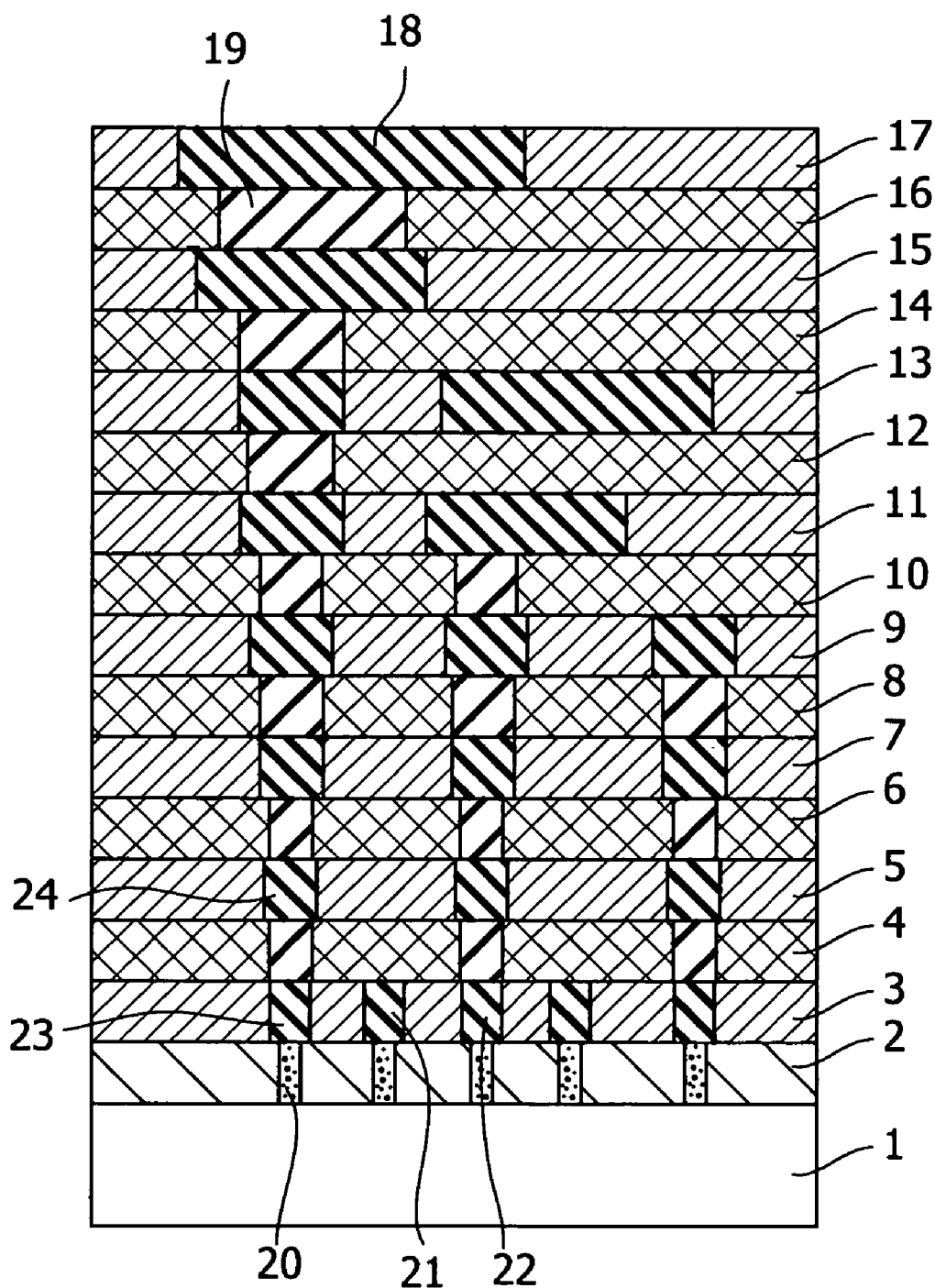
FIG. 2 is a schematic cross-sectional view of a semiconductor device of the invention.

The embodiments of the semiconductor device of the invention will be described below. FIG. 2 shows a schematic cross-sectional view of an example of the semiconductor device of the invention.

In FIG. 2, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be-greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film-with a low relative permittivity of the present invention as a via layer can greatly reduce the capacitance between the upper and lower metal interconnection layers. Therefore, using the porous film of the present invention for all of the interconnection layers and the via layers can greatly reduce the parasitic capacitance of the interconnections. When the porous film of the invention is used as an insulator film of the interconnects, the conventional problem of the increased dielectric constant caused by the film having absorbed moisture during the lamination of porous film to form the multi-level interconnects does not happen. Consequently, a semiconductor having high performance and less power consumption can be realized.

The porous film of the present invention enables a semiconductor device to have higher mechanical strength by its high mechanical strength, thereby greatly improving the yield of the fabrication and the reliability of the semiconductor device.

The invention will be described specifically through the following examples and comparative example, but is not limited to the examples.

EXAMPLE 1 to 3

In a 50 ml flak, 15.22 g of tetramethoxysilane, 4 g of water which is twice the amount required for hydrolysis of the-tetramethoxysilane, and 0.1 ml of 2N hydrochloric acid were placed for hydrolysis so that the silica precursor having weight-average molecular weight of 1450 was obtained. The weight-average molecular weight is determined with GPC using polystyrene as a standard.

Trialkoxysilane containing a different long chain alkyl group and a different surfactant as shown in Table 1 were added to the obtained silica precursor solution and then diluted with solvent (MIBK) to produce a solution of NV 20%. The NV means a value obtained by dividing the weight in the post-sintering state by the weight in the solution state.

Each obtained composition was used as a coating liquid, spin-coated on the silicon wafer, and air-dried. Then, it was heated at 100° C. for one minute to remove the solvent and then heated at 170° C. for 1 minute for forming the silica skeleton. Next, it was heated at 250° C. for ten minutes to remove the surfactant. It was then sintered at 400° C. for one hour under a nitrogen gas stream to remove the decomposition residue and to mature the film.

The obtained film was evaluated. The remainder film percentage is a ratio of the film thickness after removing the micelle-forming material by sintering to the film thickness after pre-bake which is the drying step for removing. Herein, the film thickness after pre-bake is presumed to be 100%. The film thickness was measured with ellipsometer. The dielectric constant of the film immediately after the sintering step and the film 24 hour after the sintering were measured using a mercury probe. The hardness and modulus of the film three hours after the sintering step were measured with a nano-indentor. The results are shown in Table 2.

EXAMPLE 4

In a 50 ml flak, a mixture of 11.42 g of tetramethoxysilane and 3.41 g of methyltrimethoxysilane, 6.75 g of water which is twice the amount required for hydrolysis of the mixture, and 0.1 ml of 2N hydrochloric acid were placed for hydrolysis so that the silica precursor having weight-average molecular weight of 2250 was obtained. The weight-average molecular weight was determined with GPC using polystyrene as a standard.

The trialkoxysilane containing a long chain alkyl group and the surfactant shown in Table 1 were added to the obtained silica precursor solution, and diluted with solvent (MIBK) to produce a solution of NV 20%.

This solution was used as a coating liquid to produce a sintered and matured film in the same manner as described in Examples 1 to 3. The film was then evaluated in the same manner in Examples 1 to 3. The results are shown in Table 2.

Comparative Example 1

The silica precursor solution obtained in Example 1 was diluted in solvent (MIBK) with adding neither trialkoxysilane containing a long chain alkyl group nor a surfactant. As the result, a solution of NV 20% was obtained.

This solution was used as a coating liquid to produce a sintered and matured film in the same manner as described in Examples 1 to 3. The film was then evaluated in the same manner in Examples 1 to 3. The results are shown in Table 2.

TABLE 1

|  | $Si(OMe)_4$ (g) | $MeSi(OMe)_3$ (g) | $C_{18}H_{37}Si(OMe)_3$ (g) | $C_{14}H_{29}Si(OMe)_3$ (g) | $C_{12}H_{25}Si(OMe)_3$ (g) | surfactant $C_{16}H_{33}(Me)_3N^+Cl^-$ (g) | water (g) |
|---|---|---|---|---|---|---|---|
| Example 1 | 15.2 | — | 0.2 | — | — | 3.2 | 22.0 |
| Example 2 | 15.2 | — | — | 0.2 | — | 3.2 | 22.0 |
| Example 3 | 15.2 | — | — | — | 0.2 | 3.2 | 22.0 |
| Example 4 | 11.4 | 3.4 | 0.2 | — | — | 3.2 | 21.5 |
| Comp. Ex. 1 | 15.2 | — | — | — | — | 3.2 | 22.0 |

*OMe represents $OCH_3$.

TABLE 2

| | remainder film percentage (%) | dielectic constant just after sintering | dielectic constant 24 hours later | hardness (GPa) | modulus (GPa) |
|---|---|---|---|---|---|
| Example 1 | 92 | 1.8 | 2.0 | 0.9 | 10 |
| Example 2 | 93 | 1.8 | 2.2 | 0.8 | 9 |
| Example 3 | 91 | 1.8 | 2.2 | 0.8 | 9 |
| Example 4 | 91 | 1.8 | 2.2 | 0.7 | 7 |
| Comp. Ex. 1 | 95 | 1.7 | 14.3 | 0.9 | 10 |

The invention claimed is:

1. A composition for forming porous film, comprising
a surfactant and
a solution comprising polymer obtainable by hydrolyzing and condensing, in the presence of the surfactant, one or more alkoxysilanes represented by Formula (1) and one or more alkoxysilanes represented by Formula (2):

$$(R^1)_m Si(OR^2)_{4-m} \quad (1)$$

$$R^3 Si(R^4)_n (OR^5)_{3-n} \quad (2)$$

wherein $R^1$ represents a straight chain or branched alkyl group having 1 to 7 carbons or an aryl group wherein the alkyl or aryl group may be substituted or non-substituted and when there are $R^1$s, the $R^1$s are independently the same or different; $R^2$ represents an alkyl group having 1 to 4 carbons and when there are $R^2$s, the $R^2$s are independently the same or different; $R^3$ represents a straight chain or branched alkyl group having 8 to 30 carbons; $R^4$ represents a monovalent hydrocarbon group which may be substituted or non-substituted and when there are $R^4$s, the $R^4$s are independently the same or different; $R^5$ represents an alkyl group having 1 to 4 carbons and when there are $R^5$s, the $R^5$s are independently the same or different; m is an integer of 0 to 3; and n is an integer of 0 to 2,
wherein the one or more alkoxysilanes represented by Formula (1) comprise one or more tetraalkoxysilanes wherein m=0 and one or more alkoxysilanes wherein m=1, 2 or 3, and
wherein said one or more alkoxysilanes represented by Formula (2) is present in an amount of 0.01 to 10 parts by weight to 100 parts by weight of said one or more alkoxysilanes represented by Formula (1).

2. The composition for forming porous film according to claim 1 wherein said surfactant is a compound which decomposes, evaporates or sublimes when heated to 400° C. or less.

3. The composition for forming porous film according to claim 1 wherein said one or more of the alkoxysilanes represented by Formula (1) is 10% by weight or more of tetraalkoxysilane.

4. The composition for forming porous film according to claim 1, comprising a compound which is neutral at ordinary temperature and generates acid or alkali at 80 to 200° C.

5. A method for forming porous film comprising a step of applying said composition of claim 1 on a substrate to form film and a step of transforming the film into porous film.

6. The method for forming porous film according to claim 5 wherein said step of transforming comprises a step of drying said film and a step of removing said surfactant from the dried film.

7. The method for forming porous film according to claim 5 wherein said step of transforming comprises heating at 150 to 400° C.

8. A porous film obtainable from said composition of claim 1.

9. An interlevel insulator film formable by said composition of claim 1.

10. A semiconductor device comprising an internal porous film which is formable by a composition for forming said porous film, comprising
a surfactant and
a solution comprising polymer obtainable by hydrolyzing and condensing, in the presence of the surfactant, one or more of alkoxysilane represented by Formula (1) and one or more of alkoxysilane represented by Formula (2):

$$(R^1)_m Si(OR^2)_{4-m} \quad (1)$$

$$R^3 Si(R^4)_n (OR^5)_{3-n} \quad (2)$$

wherein $R^1$ represents a straight chain or branched alkyl group having 1 to 7 carbons or an aryl group wherein the alkyl or aryl group may be substituted or non-substituted and when there are $R^1$s, the $R^1$s are independently the same or different; $R^2$ represents an alkyl group having 1 to 4 carbons and when there are $R^2$s, the $R^2$s are independently the same or different; $R^3$ represents a straight chain or branched alkyl group having 8 to 30 carbons; $R^4$ represents a monovalent hydrocarbon group which may be substituted or non-substituted and when there are $R^4$s, the $R^4$s are independently the same or different; $R^5$ represents an alkyl group having 1 to 4 carbons and when there are $R^5$s, the $R^5$s are independently the same or different; m is an integer of 0 to 3; and n is an integer of 0 to 2,
wherein the one or more alkoxysilanes represented by Formula (1) comprise one or more tetraalkoxysilanes wherein m=0 and one or more alkoxysilanes wherein m=1, 2 or 3, and
wherein said one or more alkoxysilanes represented by Formula (2) is present in an amount of 0.01 to 10 parts by weight to 100 parts by weight of said one or more alkoxysilanes represented by Formula (1).

11. The semiconductor device according to claim 10 wherein said surfactant is a compound which decomposes, evaporates or sublimes when heated to 400° C. or less.

12. The semiconductor device according to claim 10 wherein said one or more of the alkoxysilanes represented by Formula (1) is 10% by weight or more of tetraalkoxysilane.

13. The semiconductor device according to claim 10, comprising a compound which is neutral at ordinary temperature and generates acid or alkali at 80 to 200° C.

14. The semiconductor device according to claim 10 wherein said porous film is between metal interconnections in a same layer of multi-level interconnects, or is between upper and lower metal interconnection layers.

* * * * *